(12) United States Patent
Houston

(10) Patent No.: US 8,064,271 B2
(45) Date of Patent: Nov. 22, 2011

(54) STATIC RANDOM ACCESS MEMORY DEVICE HAVING BIT LINE VOLTAGE CONTROL FOR RETAIN TILL ACCESSED MODE AND METHOD OF OPERATING THE SAME

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/237,082

(22) Filed: Sep. 28, 2005

(65) Prior Publication Data
US 2007/0070773 A1 Mar. 29, 2007

(51) Int. Cl.
*G11C 7/10* (2006.01)
(52) U.S. Cl. .................................. 365/189.06; 365/203
(58) Field of Classification Search .................. 365/203, 365/189.06
See application file for complete search history.

(56) References Cited

U.S. PATENT DOCUMENTS

| | | | | |
|---|---|---|---|---|
| 4,852,064 A | * | 7/1989 | Kim et al. | 365/203 |
| 5,548,560 A | * | 8/1996 | Stephens et al. | 365/233.5 |
| 6,141,259 A | * | 10/2000 | Scott et al. | 365/189.06 |

* cited by examiner

*Primary Examiner* — Jason Lappas
(74) *Attorney, Agent, or Firm* — Rose Alyssa Keagy; Wade J. Brady, III; Frederick J. Telecky, Jr.

(57) ABSTRACT

A static random-access memory (SRAM) and a method of controlling bit line voltage. In one embodiment, the SRAM includes: (1) an array of SRAM cells organized in rows and columns, (2) bit lines associated with the columns, (3) a high voltage power supply configured to supply a high supply voltage, (4) a low voltage power supply configured to supply a low supply voltage, (5) bit line precharge circuitry configured to precharge at least one of the bit lines to a first voltage and (6) standby circuitry configured to maintain a voltage of the at least one bit line at least a second voltage, the second voltage being lower than the first voltage and higher than the low supply voltage.

24 Claims, 4 Drawing Sheets

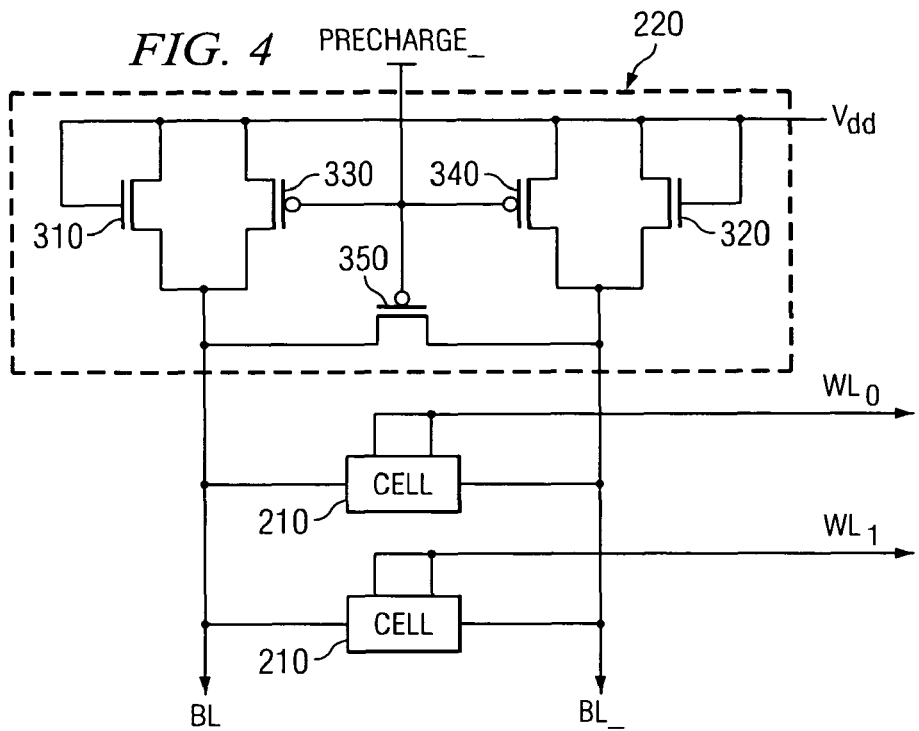
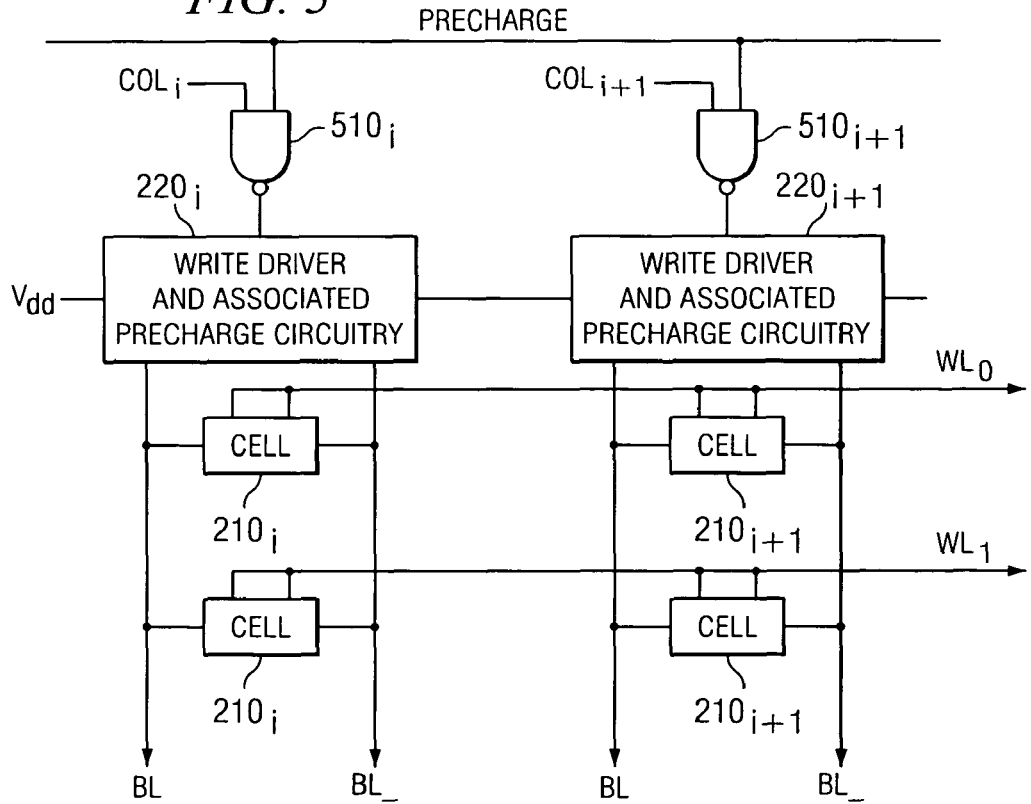

STATIC RANDOM ACCESS MEMORY DEVICE HAVING BIT LINE VOLTAGE CONTROL FOR RETAIN TILL ACCESSED MODE AND METHOD OF OPERATING THE SAME

TECHNICAL FIELD OF THE INVENTION

The present invention is directed, in general, to Static Random Access Memory (SRAM) and, more specifically, a SRAM device having a bit line voltage control for Retain Till Accessed (RTA) mode and a method of operating the same.

BACKGROUND OF THE INVENTION

Different types of memory are used in electronic apparatus for various purposes. Read-only memory (ROM) and random-access memory (RAM) are two such types of memory commonly used within computers for different memory functions. ROM retains its stored data when power is switched off and therefore is often employed to store programs that are needed for powering-up an apparatus. ROM, however, does not accommodate writing. RAM, on the other hand, allows data to be written to or read from selected addresses associated with memory cells and, therefore, is typically used during normal operation of the apparatus.

Two common types of RAM are dynamic RAM (DRAM) and static RAM (SRAM). DRAM is typically used for the main memory of computers or other electronic apparatuses since, though it must be refreshed, it is typically inexpensive and requires less chip space than SRAM. Though more expensive and space-consumptive, SRAM does not require refresh, making it faster. These attributes make SRAM devices particularly desirable for portable equipment, such as laptop computers and personal digital assistants (PDAs).

A typical SRAM device includes an array of addressable memory cells arranged in columns and rows. A typical SRAM cell includes two access transistors and a flip-flop formed with two cross-coupled inverters. Each inverter has a pull-down (driver) and a pull-up (load) transistor. The gates of the access transistors in each row are connected to a word line and the sources of each of the access transistors in each column are connected to either one of a pair of complementary bit lines, BL or BL_. Peripheral circuitry associated with the rows (or word lines) and peripheral circuitry associated with the columns (or bit lines) facilitate reading data from, and writing data to, the SRAM cells.

Generally, an SRAM block is configured to store multiple words on each row, with each word comprising multiple bits, such that the multiple bits of a single word are read or written in a single cycle. In either a read or a write cycle, one word line is turned on, as selected by the row address. All bits in the selected row are then accessed to the associated bit line pairs.

Generally, to read data from an SRAM cell, a word line driver activates a word line according to an address decoded by a row decoder and received via a control signal path that typically includes an address bus connected to the SRAM device. The access transistors of all the cells in the addressed row turn on and connect the outputs of the flip-flop to the bit line pair. Generally, the bit lines are precharged high and one or the other of each bit line pair is pulled low by the accessed cell, creating a differential voltage on each bit line pair. The cell is designed so that with the bit lines precharged high, the accessed cells are not upset by the charge on the bit lines. With n-channel access transistors in the cell, the bit lines are precharged high to within about the threshold voltage of the access transistor relative to the selected on word line voltage to be robust against cell upset. Also, with higher bit line precharge voltage, the current through the cell access transistor is greater and the differential voltage on the bit line pair is established more quickly. The differential voltages from bit line pairs selected by the word of column address are connected to sense amplifiers. The sense amplifier produces a logical 0 or 1 from the potential difference on the bit line pair, which is, in turn, provided to external circuitry of the associated electronic apparatus, perhaps through a buffer.

In a write cycle, the bit lines are precharged high, one word line is turned on, and one or the other of bit line pairs selected by the word or column address is pulled low by the write drivers to force the state of the selected cells. With the bit line pairs precharged high, the cells in the accessed row that are not written into are not upset, just as in the read cycle.

As mentioned above, to retain the data written to the SRAM array, each SRAM cell must have a continuous supply of power. SRAM devices, however, are often employed within battery-powered wireless apparatus where power consumption is an important design parameter. Accordingly, SRAM devices are often capable of operating in multiple modes, each mode representing a tradeoff in terms of speed and power consumption. One such mode is the active mode. In the active mode, the SRAM array and surrounding read and write circuitry are provided full power. The array and circuitry are therefore ready for operation at all times, and read and write speed is the fastest. Another mode is the inactive, or sleep, mode. In the inactive mode, the SRAM array is provided power so as not to lose data, but all of the surrounding read and write circuitry are turned off. The surrounding read and write circuitry must be turned back on before reading or writing can occur, and so a latency occurs in initiating a read or write access.

Another mode of operation represents a middle ground between active mode and inactive mode. Retain Till Accessed (RTA) mode calls for the read and write circuitry to remain powered. The SRAM array itself is powered at a reduced voltage sufficient to retain the stored data, but insufficient to allow reliable read or write access. When a read and write access is to be done, only the cells needed for the access are activated; the remaining cells are retained at lower voltage.

Though the RTA mode represents a decrease in latency over the inactive mode, keeping the peripheral circuitry powered reduces the power savings relative to the inactive mode. In particular, keeping the bit lines precharged adds to the power. In the inactive mode, bit lines are typically left to float for lowest power. Left to their own, the bit lines float down to near $V_{ss}$, which is effectively ground for the SRAM device. To be reactivated, they need to be precharged to $V_{dd}$, which is the operating voltage of the SRAM device. Since the bit lines generally have relatively large capacitance, recharging the bit lines from near Vss to Vdd would add undesirable latency and dynamic power to RTA mode operation.

Accordingly, what is needed in the art is a way to control the voltage of the bit lines in an RTA mode such that power is reduced without an unacceptable increase in latency or dynamic power.

SUMMARY OF THE INVENTION

To address the above-discussed deficiencies of the prior art, the present invention provides, in one aspect, an SRAM and a method of controlling bit line voltage. In one embodiment, the SRAM includes: (1) an array of SRAM cells organized in rows and columns, (2) bit lines associated with the columns, (3) a high voltage power supply configured to supply a high supply voltage, (4) a low voltage power supply configured to supply a low supply voltage, (5) bit line precharge circuitry configured to precharge at least one of the bit lines to a first voltage and (6) standby circuitry configured to maintain a voltage of the at least one bit line at least a second voltage, the second voltage being lower than the first voltage and higher than the low supply voltage.

In another aspect, the present invention provides, for use with an SRAM having an array of SRAM cells organized in rows and columns and bit lines associated with the columns, a method of controlling bit line voltage, including: (1) supplying a high supply voltage to the SRAM cells, (2) supplying a low supply voltage to the SRAM cells, (3) precharging at least one of the bit lines to a first voltage and (4) maintaining a voltage of the at least one bit line at least a second voltage, the second voltage being lower than the first voltage and higher than the low supply voltage.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the invention, reference is now made to the following descriptions taken in conjunction with the accompanying drawing, in which:

FIG. 4 illustrates a schematic and block diagram of a portion of the SRAM device of FIG. 1 showing, in particular, an alternative embodiment of a bit line voltage control circuit constructed according to the principles of the present invention;

FIG. 5 illustrates a schematic and block diagram of a portion of the SRAM device of FIG. 1 showing, in particular, an alternative embodiment of a bit line voltage control circuit wherein precharge can be carried out by addressed column;

DETAILED DESCRIPTION

Figure 1:
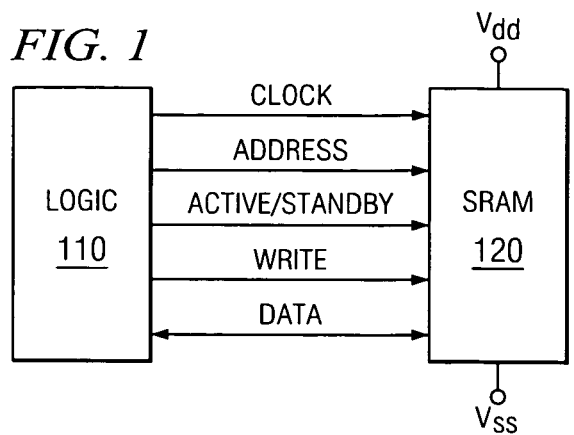
FIG. 1 illustrates a high-level block diagram of an SRAM and associated logic.

Before describing specific embodiments, some general principles associated with the present invention will be described. While IDDQ can be reduced by lowering bit line voltage, the time and dynamic power needed to restore bit line voltage to avoid upsets in switching from a low power retain mode to an active mode is undesirable for the RTA mode. The present invention is founded on the recognition that access with bit lines precharged higher than the word line voltage (the on-voltage of the selected word line) minus the threshold voltage of the cell access transistor are robust to upset. It turns out that read current is also better with the bit lines precharged to $V_{dd}$.

The overall idea is to let the bit lines float down in an RTA mode, but to restrict the lower bound of floating bit lines in the RTA mode to reduce the latency in going from the RTA mode to the active mode such that the bit lines can be precharged to above $V_{WL}-V_{tn}$, within the access cycle, or optionally with one cycle latency. ($V_{WL}$ is the voltage applied to the word line of an accessed row; $V_{tn}$ is the threshold voltage of an NMOS transistor, in this case, the threshold voltage of the SRAM cell pass gate transistor.) Optionally, the bit lines can be driven and held at the lower bound voltage in RTA instead of limiting the lower bound of float, but floating is preferable for minimization of dynamic power.

Described herein are two major categories of embodiments. In a first category, the lower bound for the bit lines in RTA is set to approximately $V_{WL}-V_{tn}$. With this option, bit line precharge is not needed to raise the bit line voltage to avoid upset. Bit line precharge is used to raise the bit line voltage above $V_{WL}-V_{tn}$ to improve read current, and optionally the bit line precharge can be applied only to the columns being read in the current cycle. Bit lines in unread columns can be left at $V_{WL}-V_{tn}$. For write access, the bit lines in the selected columns can be precharged high and one of the bit line pair pulled low by the write driver. Alternatively, precharge can be omitted for write access; the write driver drives one of the pair high and the other low. As with read access, the unselected column bit lines can be left at $V_{WL}-V_{tn}$ in write. Note that in the write cycle, the lower bound on the bit line voltage is removed for the selected columns so that the write driver can pull the bit line low.

In a second category, the lower bound for bit lines in RTA is set to a limited amount below $V_{WL}-V_{tn}$, e.g., to $V_{WL}-2^*V_{tn}$, such that the precharge can bring the bit line voltages to or above $V_{WL}-V_{tn}$ before the word line is high in the given cycle. For read access, the bit lines of all columns must be precharged to or above $V_{WL}-V_{tn}$. The bit lines of selected columns may be precharged to a higher voltage than the unselected columns to enhance read current. For write access, the bit lines of the unselected columns are precharged to or above $V_{WL}-V_{tn}$. The bit lines of the selected columns can be precharged high, and one of each pair pulled low by the write driver, or precharge can be omitted; the write driver drives both the high and the low side.

It should be noted that the minimum precharge voltage should be the minimum voltage necessary to avoid upsetting the accessed SRAM cells (in other words, maintaining the state of the accessed SRAM cells. In more specific embodiments, $V_{WL}-V_{tn}$ is used as the minimum bit line precharge voltage.

Referring initially to FIG. 1, illustrated is a high-level block diagram of an SRAM 120 and associated logic 110. FIG. 1 is presented primarily for the purpose of showing the signals provided to and derived from an exemplary SRAM, the SRAM 120. The SRAM 120 optionally receives a clock signal and an active/standby signal from the associated logic 110. Alternatively, the SRAM 120 can include an address-transition-detection circuit and initiate activity upon an address transition.

Figure 2:
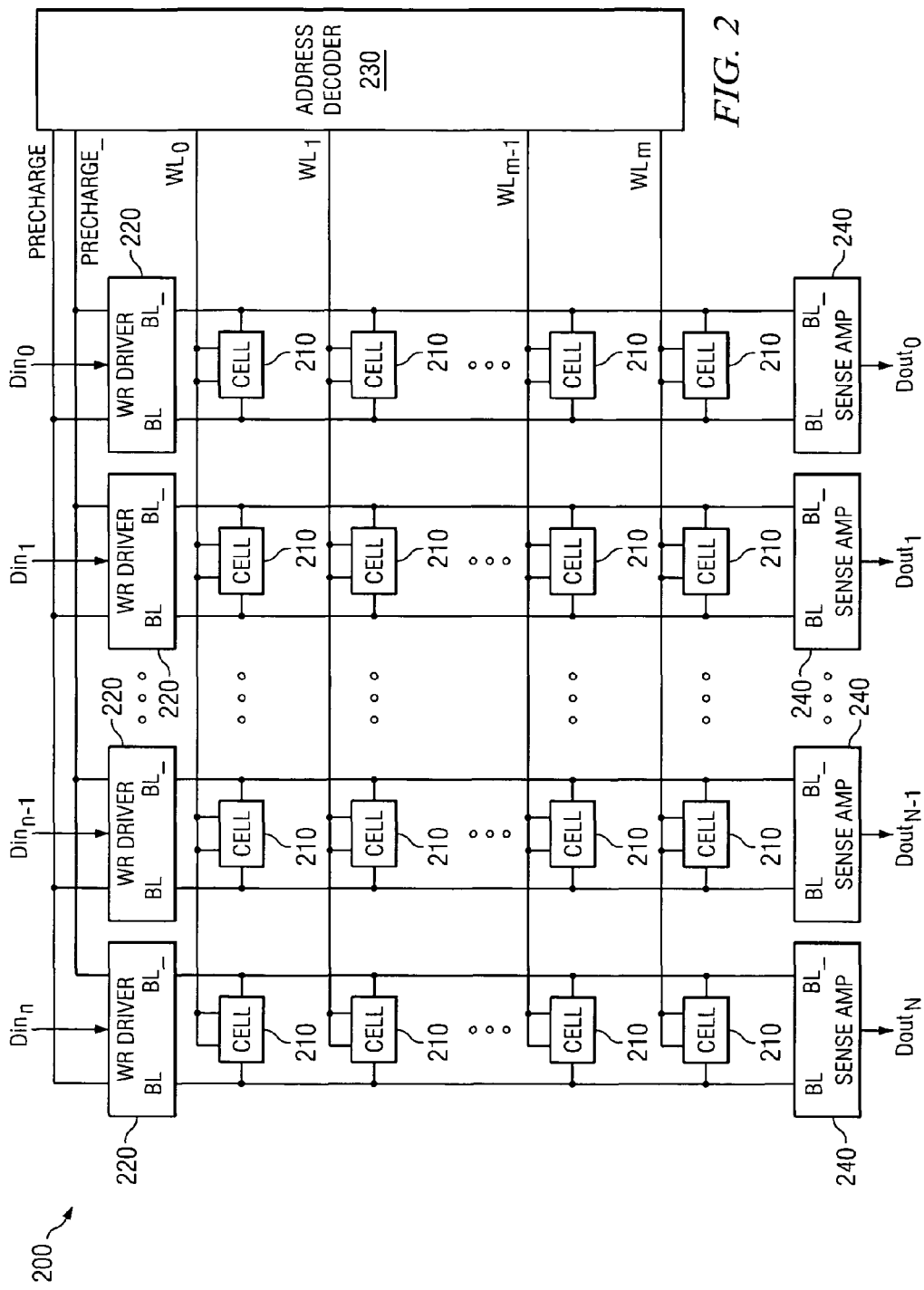
FIG. 2 illustrates a block diagram of one embodiment of an SRAM device having a bit line voltage control for RTA mode constructed according to the principles of the present invention.

Turning now to FIG. 2, illustrated is a block diagram of one embodiment of an SRAM device having a bit line voltage control for RTA mode constructed according to the principles of the present invention.

The SRAM device, generally designated 200, includes a device of addressable memory cells 210 arranged in columns and rows. For purposes of the present discussion, each SRAM cell 210 will be assumed to be conventional in construction and operation. Therefore, each SRAM cell 210 includes two access transistors and a flip-flop formed with two cross-coupled inverters (not shown, but well known to those skilled in the art). Each inverter has a pull-down (driver) and a pull-up (load) transistor. The gates of the access transistors in each row are connected to a word line (e.g., $WL_0, WL_1, \ldots WL_{m-1}, WL_m$). The sources of each of the access transistors in each column are connected to either one of a pair of complementary bit lines BL, BL_. Peripheral circuitry associated with the rows (or word lines) and peripheral circuitry associated with the columns (or bit lines) facilitate reading data from, and writing data to, the SRAM cells 210.

To write data to the SRAM device, write drivers 220 cause logical 0s or 1s ($Din_0, Din_1, \ldots Din_{n-1}, Din_n$) to be written to SRAM cells 210 in a particular row in accordance with an address as decoded by an row address decoder 230 in particular columns in accordance with an address as decoded by a column address decoder.

To read data from an SRAM cell 210, SRAM cells 210 in a particular row defined in accordance with an address as decoded by the row address decoder 230 are coupled to respective complementary bit lines BL, BL_ which, in turn, are coupled to sense amplifiers 240, optionally as selected by the column address decoder.

(Normally, a line or control signal is regarded as active in its high or logical 1 state. A trailing underscore in a line or control signal name indicates herein that the line or control signal is instead regarded as active in its low or logical 0 state.)

The sense amplifiers 240 produce logical 0s or is from the potential difference on the bit lines and complementary bit lines. The sense amplifiers 240 in turn provide the logical 0s or 1s ($Dout_0, Dout_1, \ldots Dout_{N-1}, Dout_N$) to external circuitry of the associated electronic apparatus, perhaps through a buffer, as selected by the column address decoder.

Figure 3:
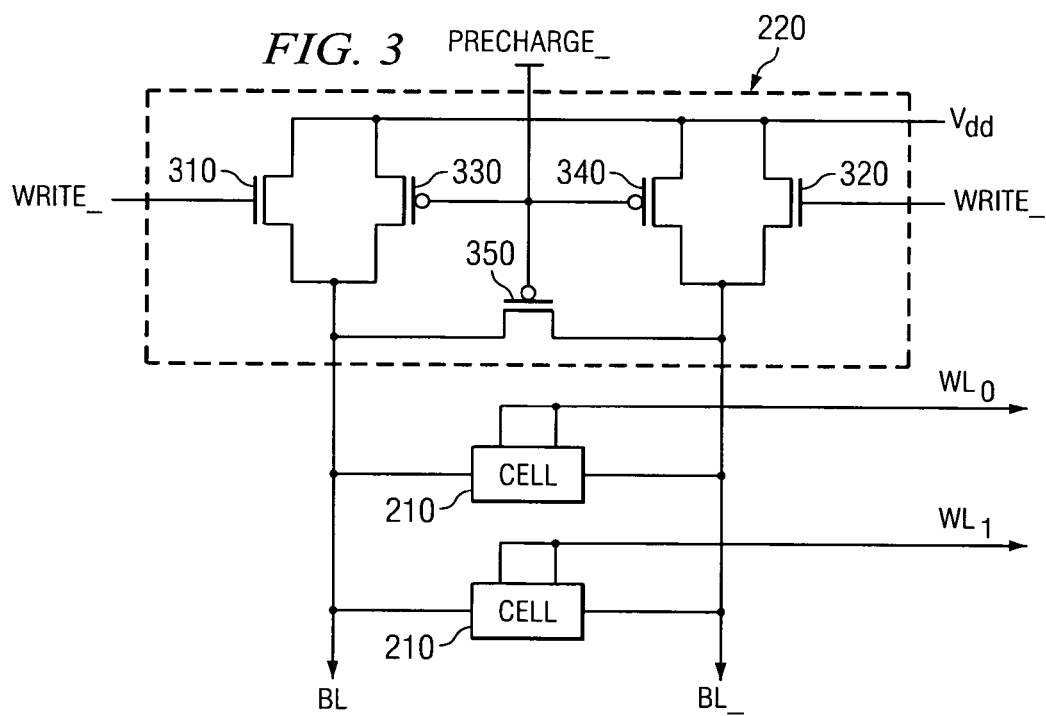
FIG. 3 illustrates a schematic and block diagram of a portion of the SRAM device of FIG. 1 showing, in particular, one embodiment of a bit line voltage control circuit constructed according to the principles of the present invention.

It is advantageous to precharge the bit lines to increase the speed at which data can be read from the SRAM cells 210 and to avoid the upset of cells in the addressed row. Accordingly, a precharge control signal, Precharge, and/or an inverted form of the precharge control signal, Precharge_, are provided to precharge circuitry associated with the write drivers 220. In the prior art, the precharge is generally started in the end of one cycle to prepare for the succeeding cycle. If a period of inactivity occurs, the bit lines are maintained in the precharged state to be ready for the next cycle in which there is an access. In the current invention, the bit lines are not maintained in the precharge state in a period of inactivity, but are instead held at a level to support precharge in the beginning of an access cycle. The precharge or precharge_ signal is supplied to the memory at the start of or before the access cycle following an inactive period. The precharge or precharge_signal can be initiated by the system logic (e.g., with an "active" signal) or by an address transition detection circuit. In either case, the signals should be set up prior to the leading clock edge of the access cycle. For example, the "active" signal can be valid one half clock cycle prior to the access. Precharge and/or Precharge_ cause the write drivers 220 to precharge and thereby condition their respective bit lines before a read takes place. The illustrated embodiment of the present invention involves a circuit that maintains bit line voltage in standby near the voltage to which they will be precharged such that precharge time is significantly reduced relative to what the precharge time would be if the bit lines float in standby. Optionally, if in standby the bit lines are kept above the voltage that may cause upset of accessed cells, for read access only the bit lines associated with the selected columns are precharged to improve the read current, and for a write access optionally there is no precharge or precharge of only the selected columns. For the case in which in standby the bit lines are kept above the voltage that may cause upset of accessed cells and of no precharge in a write access cycle, preferably the write drivers to a pair of bit lines drive one bit line of the pair high and the other bit line low rather than only driving one bit line low. FIG. 3 will address one embodiment of such a circuit.

Turning now to FIG. 3, illustrated is a schematic and block diagram of a portion of the SRAM device of FIG. 2 showing, in particular, one embodiment of a bit line voltage control circuit constructed according to the principles of the present invention. Shown are two SRAM cells 210 and respective bit lines, BL and BL_. The illustrated embodiment of the bit line control circuit includes transistors 310, 320, 330, 340, 350.

The transistors 310, 320 are n-channel transistors. They cooperate to form a standby circuit (not separately referenced) that couples a voltage source of voltage $V_{dd}$ to the bit lines BL, BL_. When the gate signal Write_ is equal to $V_{dd}$, transistors 310, 320 have an associated transistor voltage drop from the supply at $V_{dd}$ to the bit line that is approximately equal to $V_{tn}$ as those skilled in the pertinent art understand. Thus the transistors 310, 320 are configured to apply a standby voltage to the bit lines BL, BL_ that substantially equals the voltage $V_{dd}$ of the voltage source minus the transistor voltage drop $V_{tn}$. As stated above, maintaining the bit lines BL, BL_ below $V_{dd}$ reduces IDDQ. Also, where $V_{dd}$ is the high voltage of an addressed WL and $V_{tn}$ is the threshold voltage of the access transistors of the memory cells, bit line voltages at $V_{dd}-V_{tn}$ will generally not cause upset of accessed cells.

In some embodiments, a standby control signal drives the standby circuit. In the particular embodiment of FIG. 3, the standby control signal is an inverted form of a write control signal: Write_. Unless a write is being performed with respect to the bit lines BL, BL_, Write_ is high (equal to $V_{dd}$). As a result, the bit lines BL, BL_ in standby are allowed to float down to a voltage substantially equaling $V_{dd}-V_{tn}$ and not allowed to float to a lower voltage level. The lower limit on standby voltage is maintained on the bit lines BL, BL_ until precharging occurs, at which time a precharge circuit, which will now be described, predominates.

The transistors 330, 340, 350 cooperate to form a precharge circuit (not separately referenced). In the illustrated embodiment, the transistors 330, 340, 350 are p-channel transistors. The transistors 330, 340, 350 are configured to respond to a precharge control signal, Precharge_, by applying a precharge voltage, $V_{dd}$, that exceeds the standby voltage, $V_{dd}-V_{tn}$, to the bit lines BL, BL_. The transistors 330, 340 actually deliver the precharge voltage $V_{dd}$ to the bit lines BL, BL_. The transistor 350 straddles the bit lines BL, BL_, ensuring that they are precharged to substantially the same voltage. As those skilled in the pertinent art understand, a read or write can be performed once the bit lines have been precharged. Optionally for a write, the bit lines are not precharged. The bit lines in unselected columns are maintained at a voltage that will not cause upset of the accessed cells, and the bit lines of the selected columns are driven one high and one low per pair. For a read, one of a bit line pair will be left high while the other of the bit line pair is pulled low by the addressed cell. Since the sense amplifier can sense a relatively small differential voltage on the bit line pair, it is not necessary for the addressed cell to pull the one bit line much below the precharge level. Thus, the precharge transistors 330, 340, 350 are turned off, for a read, but the transistors 310, 320 can be left on while appropriate read circuits are activated. Optionally, the transistors 310, 320 are turned off for a read. For a write, one of the bit lines should be pulled substantially lower than $V_{dd}-V_{tn}$. Thus, for a write, it may be preferable to turn off transistors 310, 320 along with precharge transistors 330, 340, 350. Alternatively, if transistors 310, 320 are sufficiently weak relative to the write driver transistors, transistors 310, 320 can be left on even in write. In the latter case, the gates of 310, 320 can be tied directly to $V_{dd}$ rather than being controlled by Write_.

Those skilled in the pertinent art will recognize that different elements, such as diodes, resistors or voltage regulators may be used in place of or in conjunction with transistors 310, 320 to provide a standby voltage to the bit lines. For example, additional transistors can be connected as diodes in series with transistors 310, 320 can be used to maintain the bit line voltages above $V_{dd}-2*V_{tn}$ in standby. Also, that such elements may be left connected to the bit lines or not during a write, depending on the strength of the element relative to the write drivers. If the elements used maintain the bit line voltage in standby above a voltage that may cause upset of accessed cells, then it is not necessary to precharge nonselected columns for a read or write access. If the elements used allow the bit line to reach a voltage in standby that may cause upset of accessed cells, then all bit lines are precharged in a read cycle, and at least the bit lines of nonselected columns are precharged in a write cycle.

In one embodiment, the standby circuit and the precharge circuit may be made to operate in successive memory cycles, which support a "pipelined" operation of the SRAM device in which precharge is initiated prior the first access cycle following standby. For example, in standby the bit lines may be maintained at a voltage which may cause upset of accessed cells. The bit lines may then be precharged prior to a first access cycle to a voltage that will not cause upset of an accessed cell. A second access cycle can follow the first access cycle without additional delay.

Turning now to FIG. 4, illustrated is a schematic and block diagram of a portion of the SRAM device of FIG. 2 showing, in particular, an alternative embodiment of a bit line voltage control circuit constructed according to the principles of the present invention. FIG. 4 differs from FIG. 3 in that the gates as well as drains of transistors 310, 320 are connected to Vdd. This embodiment is particularly advantageous when the transistors 310, 320 are sufficiently weak to be driven by Write_. In all other respects, the embodiment of FIG. 4 operates like the embodiment of FIG. 3.

Turning now to FIG. 5, illustrated is a schematic and block diagram of a portion of the SRAM device of FIG. 2 showing, in particular, an alternative embodiment of a bit line voltage control circuit wherein precharge can be carried out by addressed column. FIG. 5 shows two adjacent columns, subscripted i and i+1, respectively. Each column contains a write driver and associated precharge circuitry $220_i$, $220_{i+1}$ and two cells $210_i$, $210_{i+1}$. Each column also has a NAND gate $510_i$, $510_{i+1}$ associated with it. The function of each NAND gate $510_i$, $510_{i+1}$ is to subject the Precharge signal to column select signals, $Col_i$, $Col_{i+1}$, respectively. Thus, precharge can be carried out by addressed column (as a function of $Col_i$, $Col_{i+1}$, etc.). Optionally, a third signal, WRITE_ can be input to the NAND gate such that the precharge of selected columns is only done for a read cycle.

Figure 6A:
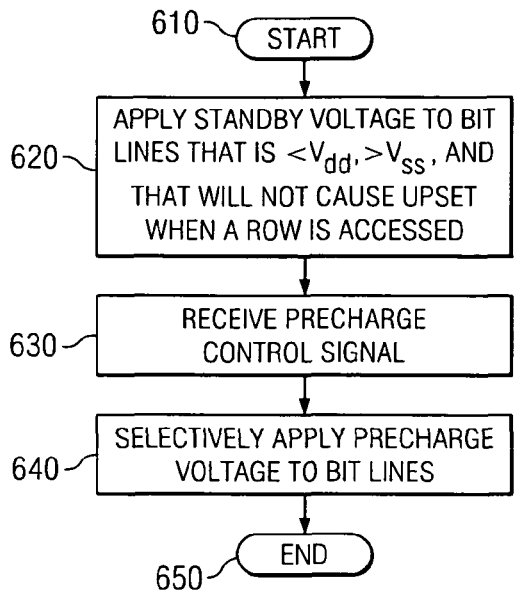
FIGS. 6A and 6B illustrates flow diagrams of alternate embodiments of a method of operating the SRAM device of FIG. 1 carried out according to the principles of the present invention.
Figure 6B:
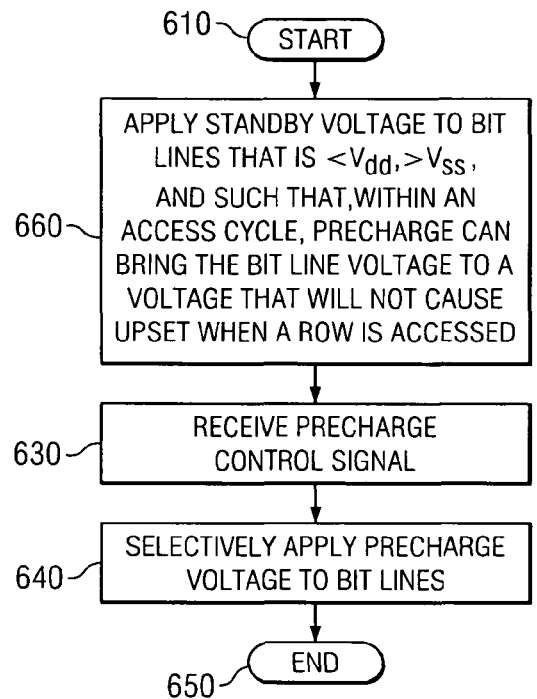

Turning now to FIGS. 6A and 6B, illustrated are flow diagrams of alternate embodiments of a method of operating the SRAM device of FIG. 1 carried out according to the principles of the present invention. The method of FIG. 6A begins in a start step 610 in which it is desired to operate an SRAM device in RTA mode.

In a step 620, a standby voltage is applied to the bit lines of the SRAM device that will not cause upset when a row is accessed. In some embodiments, the standby voltage is about $V_{WL}-V_{tn}$.

In a step 630, a precharge control signal is received. In a step 640, the precharge control signal is responded to by causing a precharge voltage to be applied to the bit lines that exceeds the standby voltage. In some embodiments, the precharge voltage may be applied to a single pair of bit lines or all of the bit lines in a selected SRAM block. In some embodiments, the precharge voltage may be applied only to selected columns in a read cycle. In some embodiments, the precharge voltage may not be applied in a write cycle. The bit lines are thereby precharged for a subsequent read or write.

As described with respect to FIG. 3, the standby mode, precharging and reading or writing can occur during the same memory cycle in different portions of the SRAM device. Thus, the steps 620, 630, 640 may occur in any order and at any time. The method ends in an end step 650.

The method of FIG. 6B is similar to that of FIG. 6B except that a step 660 replaces the step 620. The method of FIG. 6B begins in a start step 610 in which it is desired to operate an SRAM device in RTA mode. In the step 660, a standby voltage is applied to the bit lines of the SRAM device such that, within an access cycle, precharge can bring the bit line voltage to a voltage that will not cause upset when a row is accessed. In some embodiments, the standby voltage is about $V_{WL}-2*V_{tn}$.

Again, in the step 630, a precharge control signal is received. And again, in a step 640, the precharge control signal is responded to by causing a precharge voltage to be applied to the bit lines that exceeds the standby voltage. In some embodiments, the precharge voltage may be applied to a single pair of bit lines or all of the bit lines in a selected SRAM block. In some embodiments, the precharge voltage may be applied only to selected columns in a read cycle. In some embodiments, the precharge voltage may not be applied in a write cycle. Finally, the access cycle may be extended to allow time for the precharge. The bit lines are thereby precharged for a subsequent read or write.

As described with respect to FIG. 3, the standby mode, precharging and reading or writing can occur during the same memory cycle in different portions of the SRAM device. Thus, the steps 660, 630, 640 may occur in any order and at any time. The method ends in the end step 650.

Figure 7:
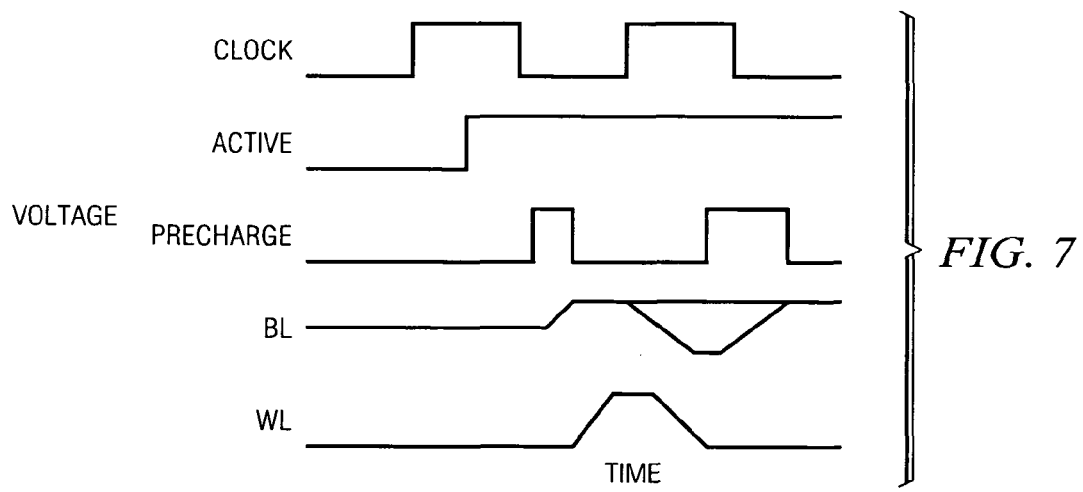
FIG. 7 illustrates a timing diagram of a transition from inactive to active states.

Turning now to FIG. 7, illustrated is a timing diagram of a transition from inactive to active states. Bit lines (BL) are at an intermediate voltage in the inactive state. The bit lines are then precharged to $V_{dd}$ at the start of the active state, before the word line (WL) is high. In the first active cycle, one or the other of the bit lines go low, either from a read access or a write access. Precharge of the bit lines is initiated in the latter part of the active cycle in preparation for the next cycle. Note that while FIG. 7 shows the memory access cycle to occupy only one clock cycle, the memory access cycle may span multiple clock cycles.

Although the present invention has been described in detail, those skilled in the art should understand that they can make various changes, substitutions and alterations herein without departing from the spirit and scope of the invention in its broadest form. For example, a memory cell could have a p-channel access transistor with bit lines precharged low and allowed to float high in standby with a limit on how high the bit line would float in standby.

What is claimed is:

1. A synchronous static random-access memory (SRAM), comprising:
    an array of SRAM cells organized in rows and columns within said synchronous SRAM;
    bit lines associated with said columns;
    a high voltage power supply configured to supply a high supply voltage;
    a low voltage power supply configured to supply a low supply voltage;
    bit line precharge circuitry configured to precharge at least one of said bit lines to a first voltage; and
    standby circuitry configured to maintain a voltage of said at least one of said bit lines to a second voltage, during standby, said second voltage being substantially equal to said high supply voltage minus a transistor voltage drop $V_{tn}$.

2. The SRAM as recited in claim 1 wherein said SRAM cells are further organized in blocks and all bit lines in an accessed one of said blocks are precharged.

3. The SRAM as recited in claim 1 wherein said bit line precharge circuitry is configured to precharge said at least one of said bit lines during an access cycle.

4. The SRAM as recited in claim 1 wherein said bit line precharge circuitry is configured to precharge said at least one of said bit lines before an access cycle.

5. The SRAM as recited in claim 1 wherein said second voltage is above about $V_{WL}-V_{tn}$.

6. The SRAM as recited in claim 1 wherein said first voltage is above a minimum voltage for maintaining a state of accessed SRAM cells.

7. The SRAM as recited in claim 1 wherein said second voltage is above a minimum voltage for maintaining a state of accessed SRAM cells and, in a read cycle, said bit line precharge circuitry is configured to precharge only ones of said bit lines corresponding to accessed SRAM cells to said first voltage.

8. The SRAM as recited in claim 1 wherein said second voltage is above a minimum voltage for maintaining a state of accessed SRAM cells and, in a write cycle, said bit line precharge circuitry is configured not to precharge said bit lines corresponding to accessed SRAM cells to a higher voltage.

9. The SRAM as recited in claim 1 wherein said second voltage is above a minimum voltage for maintaining a state of accessed SRAM cells and, in a read cycle, said bit line precharge circuitry is configured to precharge to a higher voltage only said bit lines corresponding to synchronous SRAM cells of columns located within an access row that are accessed for said read cycle.

10. The SRAM as recited in claim 1 wherein voltages of said bit lines are allowed to float to said second voltage when the SRAM array is not accessed.

11. The SRAM as recited in claim 1 wherein said second voltage is below a minimum voltage for maintaining a state of accessed SRAM cells and said first voltage is above said minimum voltage for maintaining said state of accessed SRAM cells.

12. The SRAM as recited in claim 1 wherein, during a write cycle, only bit lines associated with non-addressed columns are precharged to a voltage above a minimum voltage for maintaining a state of accessed SRAM cells.

13. A method of controlling a bit line voltage of an array of SRAM cells within a synchronous SRAM, comprising:
    supplying a high supply voltage to said SRAM cells within said synchronous SRAM;
    supplying a low supply voltage to said SRAM cells within said synchronous SRAM;
    precharging at least one of said bit lines to a first voltage; and
    maintaining a voltage of said at least one of said bit lines to a second voltage during standby, said second voltage being substantially equal to said high supply voltage minus a transistor voltage drop $V_{tn}$.

14. The method as recited in claim 13 wherein said SRAM cells are further organized in blocks and said precharging comprises precharging all bit lines in an accessed one of said blocks.

15. The method as recited in claim 13 wherein said precharging comprises precharging said at least one of said bit lines during an access cycle.

16. The method as recited in claim 13 wherein said precharging comprises precharging said at least one of said bit lines before an access cycle.

17. The method as recited in claim 13 wherein said second voltage is above about $V_{WL}-V_{tn}$.

18. The method as recited in claim 13 wherein said first voltage is above a minimum voltage for maintaining a state of accessed SRAM cells.

19. The method as recited in claim 13 wherein said second voltage is above a minimum voltage for maintaining a state of accessed SRAM cells and, in a read cycle, said precharging comprises precharging only ones of said bit lines corresponding to accessed SRAM cells to said first voltage.

20. The method as recited in claim 13 wherein said second voltage is above a minimum voltage for maintaining a state of accessed SRAM cells and, in a write cycle, said precharging comprises precharging said bit lines corresponding to accessed SRAM cells to a higher voltage.

21. The SRAM as recited in claim 1, wherein the first voltage is the about high supply voltage.

22. The SRAM as recited in claim 21 wherein the second voltage is above about $V_{WL}-V_{tn}$.

23. The method as recited in claim 13, wherein the first voltage is the about high supply voltage.

24. The SRAM as recited in claim 23, wherein the second voltage is above about $V_{WL}-V_{tn}$.

* * * * *